United States Patent
Meinkuss

(10) Patent No.: US 11,320,753 B2
(45) Date of Patent: May 3, 2022

(54) PROJECTION EXPOSURE APPARATUS FOR SEMICONDUCTOR LITHOGRAPHY INCLUDING A MAGNETIC DAMPING ARRANGEMENT

(71) Applicant: Carl Zeiss SMT GmbH, Oberkochen (DE)

(72) Inventor: Philipp Meinkuss, Nattheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/198,973

(22) Filed: Mar. 11, 2021

(65) Prior Publication Data

US 2021/0200101 A1 Jul. 1, 2021

Related U.S. Application Data

(63) Continuation of application No. PCT/EP2019/074491, filed on Sep. 13, 2019.

(30) Foreign Application Priority Data

Sep. 25, 2018 (DE) .......................... 102018216347.2

(51) Int. Cl.
*G03F 7/20* (2006.01)
*F16F 15/03* (2006.01)
*F16F 15/02* (2006.01)

(52) U.S. Cl.
CPC .............. *G03F 7/709* (2013.01); *F16F 15/03* (2013.01); *F16F 15/022* (2013.01)

(58) Field of Classification Search
CPC ......... G03F 7/709; F16F 15/03; F16F 15/022; F16F 15/035; F16C 32/0438; F16C 32/044; H02K 49/04
See application file for complete search history.

(56) References Cited

U.S. PATENT DOCUMENTS

| 5,947,237 A | 9/1999 | McMichael et al. |
| 2005/0205712 A1 | 9/2005 | Aisenbrey |

(Continued)

FOREIGN PATENT DOCUMENTS

| DE | 10 2013 212 367 A1 | 8/2014 |
| DE | 10 2015 210 484 A1 | 6/2016 |

(Continued)

OTHER PUBLICATIONS

German Office Action, with translation thereof, for corresponding DE Appl No. 10 2018 216 347.2, dated May 20, 2019.

(Continued)

*Primary Examiner* — Mesfin T Asfaw
(74) *Attorney, Agent, or Firm* — Fish & Richardson P.C.

(57) ABSTRACT

A projection exposure apparatus for semiconductor lithography includes at least one component which is provided with a damping arrangement for dissipating mechanical vibration energy. The damping arrangement includes a ferromagnetic element, through which a magnetic field passes at least partly. The magnetic flux density is inhomogeneous at least regionally. The ferromagnetic element is mounted in such a way that it is movable with a movement component in the direction of the inhomogeneity of the magnetic field.

20 Claims, 4 Drawing Sheets

(56) References Cited

U.S. PATENT DOCUMENTS

| | | | |
|---|---|---|---|
| 2007/0024829 A1* | 2/2007 | Mizuno | G03F 7/70825 |
| | | | 355/18 |
| 2008/0106361 A1 | 5/2008 | Makarovic | |
| 2008/0225253 A1 | 9/2008 | Binnard et al. | |
| 2010/0127589 A1 | 5/2010 | Kummeth | |

FOREIGN PATENT DOCUMENTS

| | | |
|---|---|---|
| DE | 10 2016 202 127 A1 | 1/2017 |
| WO | WO 2008/132064 A1 | 11/2008 |
| WO | WO 2010/136049 A1 | 12/2010 |

OTHER PUBLICATIONS

Translation of International Search Report for corresponding PCT Appl. PCT/EP2019/074491, dated Nov. 25, 2019.

* cited by examiner

Section C-C

Section D-D

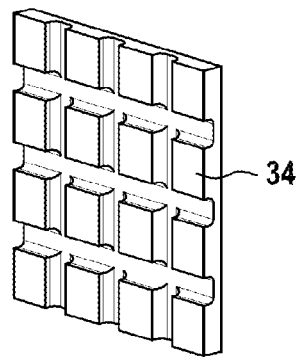
Fig. 5A
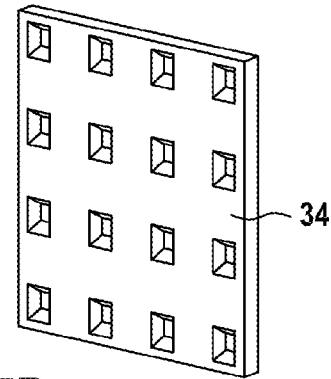
Fig. 5B
Fig. 6
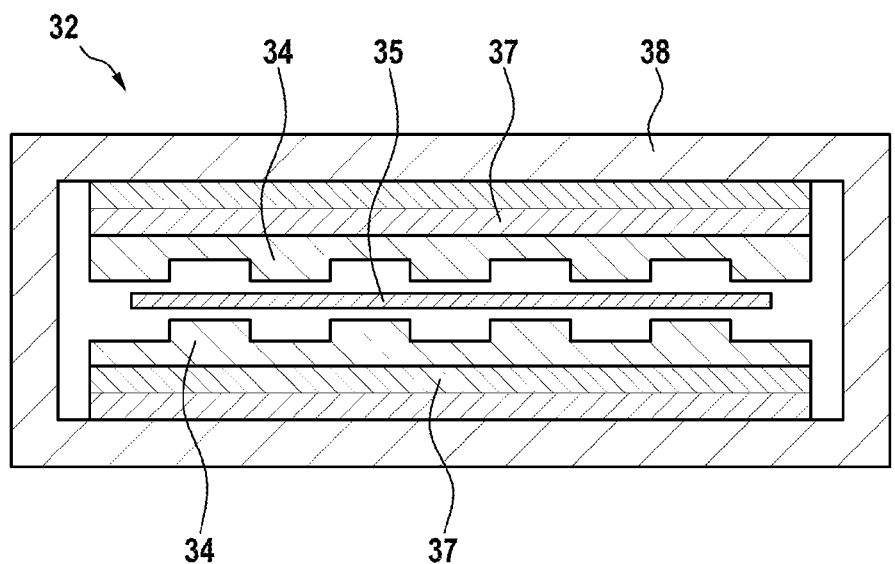

PROJECTION EXPOSURE APPARATUS FOR SEMICONDUCTOR LITHOGRAPHY INCLUDING A MAGNETIC DAMPING ARRANGEMENT

CROSS-REFERENCE TO RELATED APPLICATIONS

The present application is a continuation of, and claims benefit under 35 USC 120 to, international application PCT/EP2019/074491, filed Sep. 13, 2019, which claims benefit under 35 USC 119 of German Application No. 10 2018 216 347.2, filed Sep. 25, 2018. The entire disclosure of these applications are incorporated by reference herein.

FIELD

The disclosure relates to a projection exposure apparatus for semiconductor lithography including a damping arrangement for dissipating mechanical vibration energy.

BACKGROUND

Materials with comparatively low structural dampings, for example aluminum or Zero-dur, are usually used for components used in projection exposure apparatuses. This has the effect that vibrations that occur in the apparatus are not always sufficiently damped by the inherent dampings of the components used, which can result in performance losses to the point of instability of the apparatus. Furthermore, the large deflections of the vibrations associated with the low damping, in the case of transport, for example, can result in damage or undesired particle formation caused by abrasion or some other mechanical effect.

Conventional vibration damping is typically realized in various ways, for example by friction or by so-called resonant systems, also referred to as vibration absorbers. At the present time, both variants are usually implemented with plastic components such as rubber, for example. During use in an EUV environment, however, this can result in contamination, detachment, particles, etc. Moreover, in both variants presented, the damping achieved is frequency-dependent. This has the effect that the damping may be insufficient in certain frequency ranges. Furthermore, so-called eddy current damping can also be employed, wherein a conductive element is moved in a magnetic field. However, in this variant, too, the damping is generally speed- and thus frequency-dependent. Furthermore, in this case, the damping effect typically commences only after a certain deflection of the damper, that is to say that it may not be possible to generate a holding force that could already prevent the undesired deflection of the element to be damped.

Moreover, the published German patent application DE 10 2016 202 127 A1 discloses a damping arrangement for dissipating mechanical vibration energy of components of a projection exposure apparatus which contains a damping element, in particular an absorber spring, composed of a magnetic shape memory alloy. In that case, the damping element is exposed to a magnetic field, whereby the elastic properties of the absorber spring can be influenced. Here the damping effect is based on a force-displacement characteristic curve with a pronounced mechanical hysteresis. This pronounced hysteresis can have the effect that during a contraction/expansion cycle described by the respective hysteresis, a high proportion of energy may be dissipated, i.e. generally converted into heat. However, in the case of the device described in the cited document, too, the damping effect is frequency-dependent and generally depends in particular on the elastic properties of the absorber spring and the absorber mass used.

SUMMARY

The present disclosure seeks to provide a projection exposure apparatus including an effective damping device for the widest possible frequency ranges.

In a general aspect, the disclosure provides a projection exposure apparatus for semiconductor lithography, which includes at least one component which is provided with a damping arrangement for dissipating mechanical vibration energy, wherein the damping arrangement includes a ferromagnetic element, through which a magnetic field passes at least partly. In this case, the magnetic flux density is inhomogeneous at least regionally and the ferromagnetic element is mounted in such a way that it is movable with a movement component in the direction of the inhomogeneity of the magnetic field.

This inhomogeneity of the magnetic flux density can be produced by an inhomogeneous magnetic field. It can for example also be produced by virtue of the ferromagnetic element being partly situated in an otherwise homogeneous magnetic field. The desired damping can be achieved by virtue of the ferromagnetic material exhibiting a pronounced hysteresis with regard to the magnetization. During a relative movement between the ferromagnetic element and the field with a movement component in the direction of the inhomogeneity of the magnetic field, the ferromagnetic element can undergo magnetization reversal regionally, since the magnetic flux density in the ferromagnetic element changes over time, which can ultimately result in a dissipation of the kinetic energy into heat.

A damping mechanism according to the disclosure can be distinguished for example by the fact that the damping effect—unlike in the case of eddy current brakes for example—already commences upon the beginning of the movement to be damped; it is thus similar to damping by Coulomb friction, but without direct mechanical contact. An arrangement according to the disclosure can thus also be used as a transport safeguard as well as for protection against vibrations caused by earthquakes. The absence of a mechanical contact furthermore can result in extensive freedom from particles and wear. Furthermore, the damping effect achieved with an arrangement according to the disclosure can be virtually independent of frequency; the damping effect can furthermore be set actively by way of an adaptation of the magnetic field.

Furthermore, damping according to the present disclosure can be effected via a pure rigid body movement rather than—as described in many known instances—with deformation of a body. A deformation of surfaces can thus be advantageously avoided, thus resulting in the potential for new possibilities for example for suitable configurations and/or coatings of the surfaces involved.

In some embodiments, at least one structured soft-magnetic element for producing the inhomogeneity of the magnetic field can be present. In this case, the structured soft-magnetic element can serve to condition the magnetic field in the desired manner by way of the geometry of the element. In this regard, for example, an inhomogeneous magnetic field can be generated from a homogeneous magnetic field via of the soft-magnetic element.

This can be achieved for example by virtue of the fact that the structured soft-magnetic element can be a plate provided with a surface topography; for example, the surface topography of the plate can be formed by a matrixlike arrangement of elevations and/or depressions. However, elevations or depressions need not necessarily be involved. A soft-magnetic element with perforations in the manner of a perforated sheet can also be expedient for specific applications.

Furthermore, two structured soft-magnetic elements can be present, between which a gap is formed, wherein the ferromagnetic element is situated at least partly in the gap.

Mounting and movement of the ferromagnetic element for example in a gap can be facilitated by virtue of the element being embodied in the form of a plate.

The magnetic field can be generated using permanent magnets, but also electromagnets. Mixed forms are also conceivable.

For example, a plurality of magnets in a Halbach arrangement for generating the magnetic field can be present. A Halbach arrangement consists of a plurality of magnets, the magnetization direction of which is tilted relative to one another in each case by 90° in the direction of the longitudinal axis of the arrangement. In this case, what can be achieved via the Halbach arrangement is that a strong magnetic field arises in the inner region of the structure formed by the magnets, but the overall arrangement generates only a weak magnetic field toward the outside. Undesirable influencing of surrounding components can likewise be effectively reduced as a result.

In some embodiments, a soft-magnetic shielding structure for shielding the magnetic field generated is present. What can thus be achieved is that surrounding components such as sensors or actuators are not disturbed by the magnetic field generated by the damping arrangement; moreover, the magnetic field within the structure can also be amplified by the soft-magnetic shielding structure.

The inhomogeneity of the magnetic field can alternatively or additionally also be achieved by the magnetic field being generated by an arrangement including a plurality of individual magnets. In this case, at least one of the individual magnets can be a permanent magnet; an electromagnet can likewise be employed for realizing at least one individual magnet. In the extreme case, structured soft-magnetic elements can be dispensed with when the inhomogeneous magnetic field is generated in such a way.

The ferromagnetic element can be mounted in a movable fashion in particular via a flexure. Flexures are distinguished by the fact that their actuation can give rise to practically no abrasion and thus no harmful particle formation.

In conjunction with the spring stiffness of the flexure, an end position damper can also be realized in this way. An end position damper is understood to mean a damping element which manifests its damping effect on the last segment of a permissible deflection of a component. Hard striking of a stop and the potentially harmful high inertial forces associated therewith can be avoided in this way.

The component provided with the damping arrangement can be for example a mirror facet of a field facet mirror used in an illumination system of a projection exposure apparatus. In this case, the damping arrangement can be embodied in such a way that the mirror facet is not damped in its actuation directions.

In this regard, it can be expedient, for example, to permit movements in the Rx and Ry degrees of freedom, that is to say in the direction of the customary actuation of the mirror facet by the associated actuator system, and to damp a movement of the mirror facet in some other degree of freedom, in particular Rz. This direction-selective damping ensures that the actuator system does not have to work against the damping effect of the damping arrangement during customary operation of the apparatus.

BRIEF DESCRIPTION OF THE DRAWINGS

Exemplary embodiments and variants of the disclosure are explained in more detail below with reference to the drawings, in which:

FIGS. 5A and 5B show exemplary matrices; and

FIGS. 6,7,8 show further variants of the disclosure.

DESCRIPTION OF EXEMPLARY EMBODIMENTS

Figure 1:
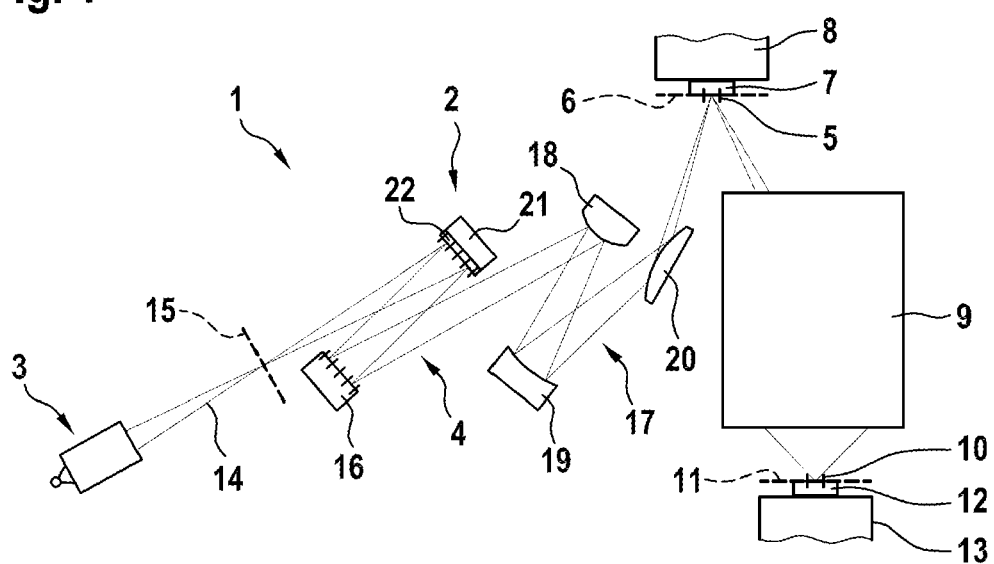
FIG. 1 shows by way of example the basic construction of an EUV projection exposure apparatus.

FIG. 1 shows by way of example the basic construction of a microlithographic EUV projection exposure apparatus 1 in which the disclosure can find application. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2, on which mirror facets 22 are arranged on a main body 21. Downstream of the field facet mirror 2, the EUV radiation 14 is reflected by a pupil facet mirror 16. With the aid of the pupil facet mirror 16 and an optical assembly 17 having mirrors 18, 19 and 20, mirror facets 22 of the field facet mirror 2 are imaged into the object field 5.

A reticle 7 arranged in the object field 5 and held by a schematically illustrated reticle holder 8 is illuminated. A merely schematically illustrated projection optical unit 9 serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly represented wafer holder 13. The light source 3 can emit used radiation in particular in a wavelength range of between 5 nm and 120 nm.

The disclosure can likewise be used in a DUV apparatus, which is not explicitly shown here. A DUV apparatus is set up in principle like the above-described EUV apparatus 1, wherein mirrors and lens elements can be used as optical elements in a DUV apparatus and the light source of a DUV apparatus emits used radiation in a wavelength range of 100 nm to 300 nm.

Figure 2:
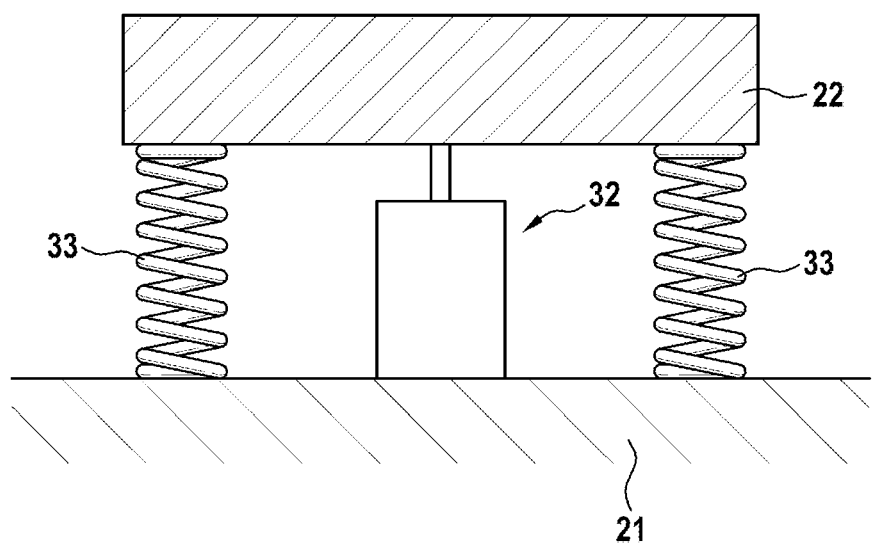
FIG. 2 shows the arrangement of the damping arrangement according to the disclosure between a structure to be damped and the fixed world.

FIG. 2 shows a schematic illustration of the arrangement of the damping arrangement 32 according to the disclosure between a structure to be damped, for example a mirror facet 22 of the field facet mirror 2 illustrated in FIG. 1, and the fixed world, the main body 21 of the field facet mirror 2 in the example shown. By virtue of the elastic elements 33 that are likewise illustrated schematically, the oscillatory coupling of the mirror facet 22 to the main body 21 is elucidated in the manner of a mechanical equivalent circuit diagram.

Figure 3:
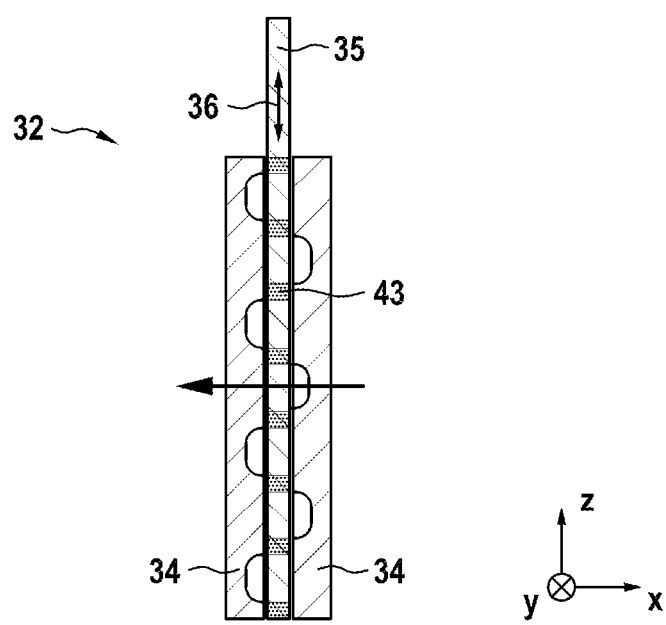
FIG. 3 shows a sectional illustration of the damping arrangement in a first exemplary embodiment.

FIG. 3 then shows a sectional view of the damping arrangement 32 in a first exemplary embodiment. FIG. 3 reveals the two structured soft-magnetic elements 34, which are referred to as matrices hereinafter. The matrices 34 are distinguished by the fact that they are provided with a structured surface topography, such that in the presence of an external magnetic field (indicated by an arrow in the figure) in the air gap between the matrices, regions 43 (illustrated in a dotted manner in the figure) of high magnetic flux density form, in which the ferromagnetic element situated in the air gap is locally magnetized. In this case, the ferromagnetic element 35, as indicated by the double-headed arrow 36, is realized such that it is movable relative to the matrices 34 and guided optionally by a guide (not illustrated). It goes without saying that the ferromagnetic element 35 need not necessarily be connected to the structure to be damped; it can likewise be connected to the fixed world, while the matrices 34 are connected to the structure to be damped.

Figure 4:
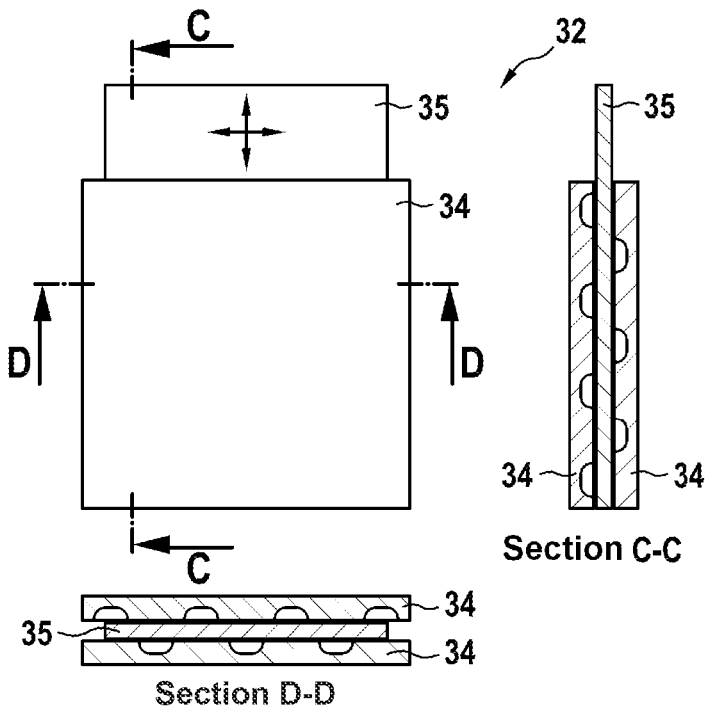
FIG. 4 shows an illustration of the damping effect in two spatial directions.

FIG. 4 elucidates the fact that the damping arrangement 32 illustrated in a sectional view in FIG. 3 can manifest its damping effect in two spatial directions, as indicated by the two double-headed arrows illustrated in a crossed manner in FIG. 4. In this case, the ferromagnetic element 35 and also the matrices 34 are embodied as elements in the form of plates.

FIGS. 5A and 5B show, in a perspective illustration, exemplary matrices 34 in a front view (5A) and a rear view (5B).

FIG. 6 likewise shows a sectional illustration of a variant of the disclosure in which the magnetic field is generated by the two permanent magnets 37 in the form of plates; in addition, the damping arrangement 32 includes a soft-magnetic shielding structure 38, by which, firstly, the magnetic field generated by the permanent magnets 37 is shielded toward the outside and, secondly, the magnetic circuit is closed.

Figure 7:
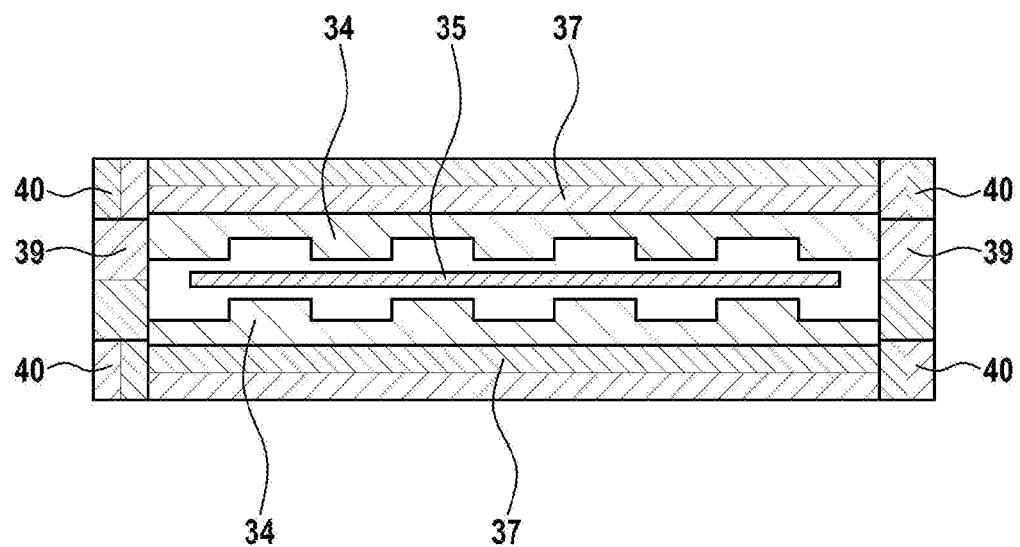

FIG. 7 shows a further variant of the disclosure employing permanent magnets 37, 39 and 40 in the so-called Halbach arrangement; here, too, a strong magnetic field is generated in the region of the matrices 34 and the ferromagnetic element 35, whereas only a weak magnetic field is measurable in the outer region.

Figure 8:
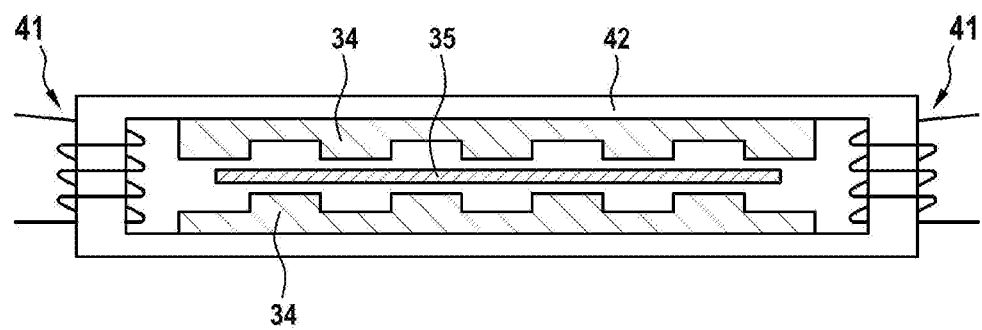

FIG. 8 shows an arrangement in which the use of permanent magnets can be dispensed with. In this case, an electromagnetic arrangement is realized by a soft iron casing 42 in conjunction with a coil winding 41, and affords the advantage that it is embodied firstly as switchable and also as apportionable with regard to the damping force on account of the adjustability of the magnetic field.

LIST OF REFERENCE NUMBERS

1 EUV projection exposure apparatus
2 Field facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate focal plane
16 Pupil facet mirror
17 Optical assembly
18 Mirror
19 Mirror
20 Mirror
21 Main body
22 Structure to be damped, mirror facet
32 Damping arrangement
33 Elastic elements
34 Matrices
35 Ferromagnetic element
36 Double-headed arrow
37 Permanent magnets
38 Shielding structure
39 Permanent magnet
40 Permanent magnet
41 Coil winding
42 Soft iron casing
43 Regions of high magnetic flux density

What is claimed is:

1. An apparatus, comprising:
a component comprising a damping arrangement configured to dissipate mechanical vibration energy,
wherein:
the damping arrangement comprises a ferromagnetic element and a first structured soft-magnetic element;
the component is configured so that, when the component is exposed to a magnetic field, the first structured soft-magnetic component produces an at least regional inhomogeneity in a flux density of the magnetic field, and the ferromagnetic element is moveable in a direction of the inhomogeneity in the flux density of the magnetic field; and
the apparatus is a semiconductor lithography projection exposure apparatus.

2. The apparatus of claim 1, wherein the structured soft-magnetic element comprises a plate having a surface topography.

3. The apparatus of claim 1, wherein the structured soft-magnetic element comprises a plate with a surface comprising elevations and/or depressions.

4. The apparatus of claim 1, wherein the structured soft-magnetic element comprises a plate with a surface comprising a matrixlike arrangement of elevations and/or depressions.

5. The apparatus of claim 1, wherein the damping arrangement further comprises a second structured soft-magnetic element, and the ferromagnetic element is disposed between the first and second structured soft-magnetic elements.

6. The apparatus of claim 1, wherein the ferromagnetic element comprises a plate.

7. The apparatus of claim 1, wherein the damping arrangement further comprises at least one permanent magnet configured to generate the magnetic field.

8. The apparatus of claim 1, wherein the damping arrangement further comprises at least one electromagnet configured to generate the magnetic field.

9. The apparatus of claim 1, wherein the damping arrangement further comprises a plurality of magnets in a Halbach arrangement configured to generate the magnetic field.

10. The apparatus of claim 1, wherein the damping arrangement further comprises a soft-magnetic shielding structure configured to shield the magnetic field.

11. The apparatus of claim 1, wherein the damping arrangement further comprises a flexure, wherein the ferromagnetic element is mounted via the flexure.

12. The apparatus of claim 1, wherein the component comprises a mirror facet of a field facet mirror.

13. The apparatus of claim 1, wherein the component comprises a mirror facet of a field facet mirror, and the damping arrangement is configured so that the mirror facet is not damped in its actuation directions.

14. The apparatus of claim 1, wherein:
the damping arrangement further comprises a second structured soft-magnetic element;
the first structured soft-magnetic element comprises a surface which comprises elevations and/or depressions;
the second structured soft-magnetic element comprises a surface which comprises elevations and/or depressions; and
the ferromagnetic element is disposed between the surface of the first soft-magnetic element and the surface of the second structured soft-magnetic element.

15. The apparatus of claim 14, wherein the component comprises a mirror facet of a field facet mirror.

16. The apparatus of claim 1, wherein:
the damping arrangement further comprises a second structured soft-magnetic element;
the first structured soft-magnetic element comprises a plate having a surface which comprises elevations and/or depressions;
the second structured soft-magnetic element comprises a plate having surface which comprises elevations and/or depressions;
the ferromagnetic element comprises a plate; and
the ferromagnetic element is disposed between the surface of the first soft-magnetic element and the surface of the second structured soft-magnetic element.

17. The apparatus of claim 16, wherein the component comprises a mirror facet of a field facet mirror.

18. The apparatus of claim 1, wherein the structured soft-magnetic element comprises a surface topography.

19. The apparatus of claim 1, wherein the structured soft-magnetic element comprises a surface comprising elevations and/or depressions.

20. The apparatus of claim 1, wherein the structured soft-magnetic element comprises a surface comprising a matrixlike arrangement of elevations and/or depressions.

* * * * *